United States Patent
Milshtein et al.

(10) Patent No.: US 6,204,714 B1
(45) Date of Patent: *Mar. 20, 2001

(54) VARIABLE WIDTH PULSE GENERATOR

(75) Inventors: Mark S. Milshtein, Hillsboro; Thomas D. Fletcher, Portland, both of OR (US); Kevin (Xia) Dai, Santa Clara, CA (US); Terry I. Chappell, Portland; Milo D. Sprague, Aloha, both of OR (US)

(73) Assignee: Intel Corp., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/159,548

(22) Filed: Sep. 24, 1998

Related U.S. Application Data

(63) Continuation-in-part of application No. 09/002,148, filed on Dec. 31, 1997, now Pat. No. 6,023,182.

(51) Int. Cl.[7] .................................................. H03K 1/04

(52) U.S. Cl. ............................................ 327/299; 327/276

(58) Field of Search .................................. 327/227–230, 327/172–176, 261, 263, 264, 276, 277, 278, 281, 284, 285, 288, 291

(56) References Cited

U.S. PATENT DOCUMENTS

| | | | |
|---|---|---|---|
| 5,086,237 | * 2/1992 | Matsumoto | 327/227 |
| 5,495,194 | 2/1996 | Sugawara | 327/113 |
| 5,530,387 | 6/1996 | Kim | 327/119 |
| 5,548,235 | 8/1996 | Marbot | 327/158 |
| 5,586,308 | 12/1996 | Hawkins et al. | 395/556 |
| 5,614,841 | 3/1997 | Marbot et al. | 326/52 |
| 5,642,068 | * 6/1997 | Wojcicki et al. | 327/172 |
| 5,689,200 | * 11/1997 | Ting et al. | 327/78 |
| 5,726,595 | * 3/1998 | Lin et al. | 327/155 |
| 5,959,485 | * 9/1999 | Roohparvar | 327/227 |

* cited by examiner

Primary Examiner—My-Trang Nuton
(74) Attorney, Agent, or Firm—Kenyon & Kenyon

(57) ABSTRACT

A variable width pulse generator. The pulse generator includes a pulse circuit responsive to a reset signal to provide a pulse circuit signal. A variable delay reset loop path, coupled to the pulse circuit, is responsive to the pulse circuit signal to provide the reset signal. A control signal may vary the width of a pulse generated by the circuit by varying the length of a delay associated with the reset loop path. Both a coarse control signal, such as a signal that selectively removes a logic element in the reset loop path, and a fine control signal, such as a signal that controls a tunable delay element in the reset loop path, may be used to adjust the pulse width.

21 Claims, 6 Drawing Sheets

VARIABLE WIDTH PULSE GENERATOR

CROSS REFERENCE TO RELATED APPLICATIONS

The present invention is a continuation-in-part of U.S. patent application Ser. No. 09/002,148, entitled "High Gain Pulse Generator Circuit for Clocking," to Mark Milshtein, Thomas Fletcher and Terry Chappell, filed Dec. 31, 1997 now U.S. Pat. No. 6,023,182.

FIELD

The present invention relates to pulse generators. More particularly, the present invention relates to a pulse generator that provides a variable width pulse.

BACKGROUND

An important goal when designing a processor is to maximize the processor's performance, or speed, for logic operations. One way this is done is by using a clock signal, such as the one shown in FIG. 1 (CLOCK), to synchronize logic operations. Typically, a CLOCK signal is "low" for a fixed period of time and "high" for the same fixed period of time.

A processor's performance can be further enhanced if a "pulse" signal, such as a pulse clock signal, is used. An example of a pulse clock signal is also shown in FIG. 1 (PULSE 1). As can be seen, the PULSE 1 signal is "high" for only a brief period of time and can be generated, for example, when the CLOCK signal transitions from a low level to a high level. This transition from low to high is also known as a "rising edge" of a signal. Both the rising and falling edges of each pulse in the PULSE 1 signal are generated by a single rising edge of the CLOCK signal, and each pulse is basically a "one-shot" of a CLOCK signal edge. The amount of time that each pulse remains high can be thought of as the "width" of the pulse (W). A pulse can similarly be generated by the falling edge of the CLOCK signal. In some cases, it is desirable to generate pulses in response to both the rising and falling edges in the CLOCK signal (PULSE 2). In either case, logic that uses a pulse signal can offer both speed and gain advantages over circuits that use a normal CLOCK signal.

Circuits that use pulse signals, however, can be complex to design. Moreover, different functions or circuits in a processor may require pulses of different widths. In this case, it is necessary to design multiple pulse generator circuits, each creating pulses of different widths. This can be an expensive and time consuming task. If a single pulse generator circuit could produce pulses having different widths, the same circuit could be used throughout the processor for different functions, thus simplifying the design.

Another problem with pulse signal circuits is that they are difficult to test and debug. Even a slight variation in pulse width can cause problems. If a pulse generator circuit could provide variable width pulses, and if those widths could be selected by, for example, one or more control signals, then the pulse width could be adjusted during the debugging process to reveal the cause of the problem.

In view of the foregoing, it can be appreciated that a need exists for a pulse generator that solves the problems discussed above.

SUMMARY

In accordance with an embodiment of the present invention, a pulse generator is provided. The pulse generator includes a pulse circuit responsive to a reset signal to provide a pulse circuit signal. The pulse generator also includes a variable delay reset loop path coupled to the pulse circuit. The variable delay reset loop path is responsive to the pulse circuit signal to provide the reset signal.

DETAILED DESCRIPTION

Figure 2:
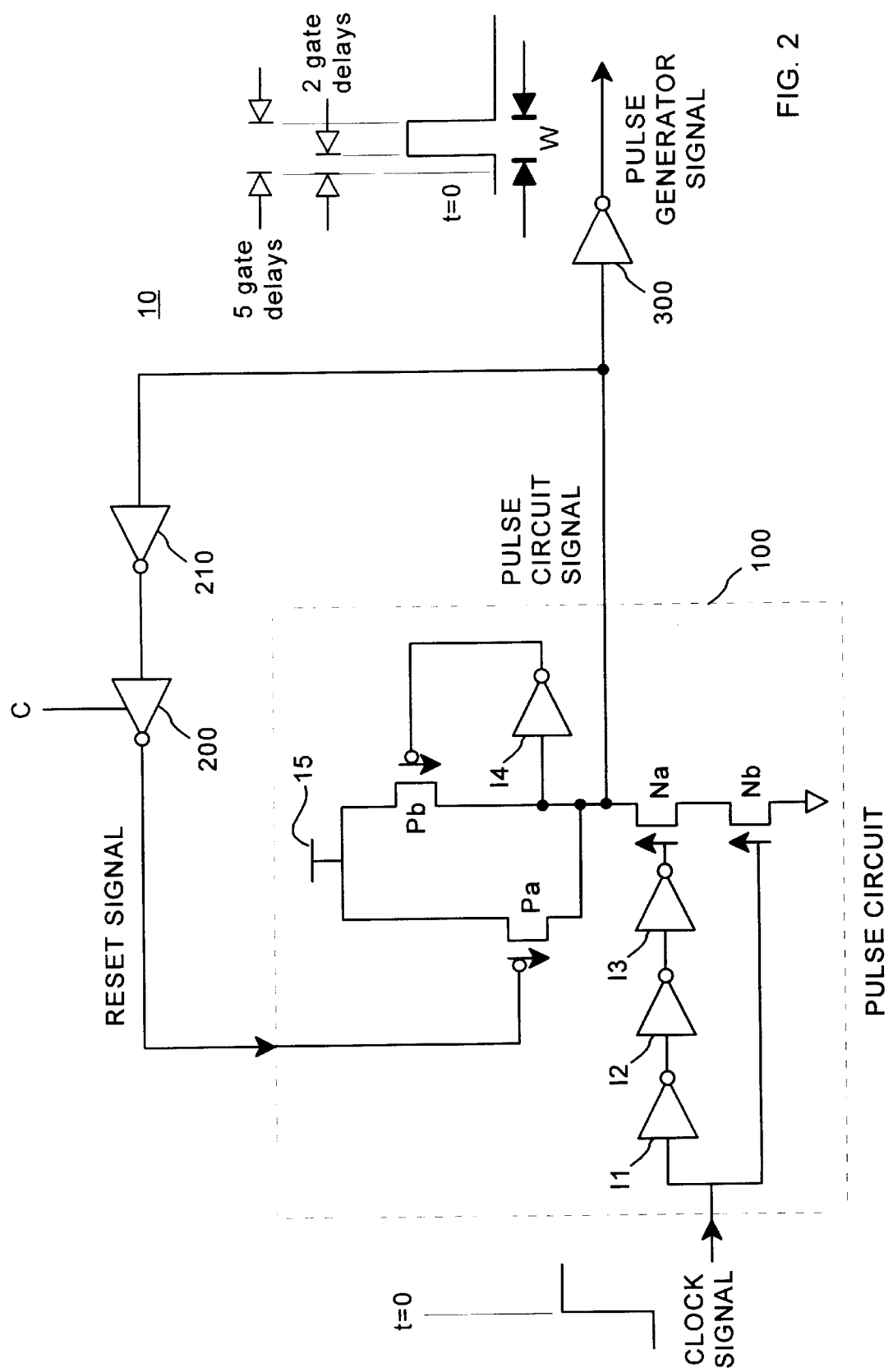
FIG. 2 is a circuit diagram of a variable width pulse generator according to an embodiment of the present invention.

An embodiment of the present invention is directed to a pulse generator that provides a variable width pulse. Referring now in detail to the drawings wherein like parts are designated by like reference numerals throughout, FIG. 2 illustrates a circuit diagram of a variable width pulse generator 10 according to an embodiment of the present invention. The pulse generator 10 includes a pulse circuit 100 that accepts a clock signal and produces a pulse circuit signal. The pulse circuit 100 has a series of inverter I1, I2, I3 coupled between the clock signal and the gate of an n-channel transistor Na. The gate of an n-channel transistor Nb is connected to the clock signal.

The pulse circuit signal is provided at the drain of transistor Na. The source of transistor Na is connected to the drain of transistor Nb to form a stack of n-channel transistors. The source of transistor Nb is connected to a pull-down voltage source, such as ground. The pulse circuit signal is connected to an output inverter 300 to provide the variable width pulse generator signal. The output inverter 300 may be, for example, a static Complementary Metal Oxide Semiconductor (CMOS) inverter, a dynamic inverter, a reset assist inverter, or the like.

The pulse circuit 100 also includes two p-channel transistors Pa and Pb. The sources of both transistors Pa and Pb are connected to a pull-up voltage source 15, which may be, for example, 1.8 or 2.5 volts. The drains of both transistors Pa and Pb are connected to the pulse circuit signal. An inverter 14 is connected between the pulse circuit signal and the gate of transistor Pb.

Two inverters 210, 200 are connected in series between the pulse circuit signal and the gate of transistor Pa. The output of inverter 200 is the "reset" signal of the pulse circuit 100. As explained in detail below, these two inverters 210, 200 form a variable delay reset loop path that automatically resets the pulse generator 100. A control signal (C) is input to one of the inverters 200 in the reset loop path to control the width (W) of each pulse produced by the output invertor 300.

The operation of the variable width pulse generator 10 will now be described. The stack of n-channel transistors Na and Nb respond to the clock signal and generate a "rising" edge in the pulse generator signal, while the p-channel transistors Pa and Pb respond to a change in the pulse circuit signal and generate a "falling" edge in the pulse generator signal as described more fully below. According to an embodiment of the present invention, the time between these rising and falling edges, or W, can be varied.

Initially the clock signal is low and transistor Nb is "off," or not conducting, and transistor Na is "on," or conducting. The pulse circuit signal is initially high, which creates a low output from the inverter 300, or a low pulse generator signal. The low from the inverter I4 turns on the p-channel transistor Pb, thereby reinforcing the high level of the pulse circuit signal. Therefore, transistor Pb can be referred to as a "keeper" transistor because it keeps or reinforces the high level of the pulse circuit signal. The low input to the inverter 200 from the inverter 210 creates a high reset signal to the gate of p-channel transistor Pa, thereby turning off transistor Pa.

At time t=0, the clock signal has a rising edge. This turns on transistor Nb, which pulls down the pulse circuit signal from a high level to a low level, and creates the rising edge of the pulse generator signal. The rising edge of the pulse generator signal is delayed from the change in the pulse circuit signal by one "gate delay." This is because of the time it takes the output inverter 300 to change states. Note that the keeper transistor Pb is a relatively small device. Therefore, the current from the larger transistor Nb overcomes the transistor Pb and pulls down the pulse circuit signal to a low level.

Therefore, it can be seen that the rising edge of the pulse generator signal is generated two gate delays after, and in response to, the rising edge of the clock signal, or t=0. The first gate delay results from the gate delay for transistor Nb to turn on. The second gate delay results from the output inverter 300 switching.

The low level on the pulse circuit signal creates a high level on the gate of the p-channel transistor Pb due to the inverter I4. This high on the gate of transistor Pb turns off transistor Pb three gate delays after the rising edge of the clock signal, including the extra gate delay for Pb to switch to a fully non-conducting, or off, state.

In addition, the high on the output of inverter 210 creates a low reset signal at the output of inverter 200, which turns on p-channel transistor Pa four gate delays after the rising edge of the clock signal, including one gate delay for Pa to switch to a fully conducting, or on, state. Also, the high on the clock signal ripples through inverters I1, I2 and I3 to create a low level on the gate of transistor Na, thereby turning off transistor Na four gate delays after the rising edge of the clock signal. The combination of transistor Pa turning on and transistor Na turning off pulls up the pulse circuit signal to a high level. The transistor Pa is called a "precharge" transistor because when transistor Pa is turned on, it pre-charges or pulls up the pulse circuit signal to a high level. Due to the output inverter 300, the low-to-high transition on the pulse circuit signal creates the falling edge in the variable width pulse generator signal five gate delays after the rising edge of the clock signal, or t=0.

After a complete pulse, both rising and falling edge, is generated for the pulse generator signal, the pulse clock circuit 100 is automatically reset. The high level of the pulse circuit output creates a low on the gate of p-channel transistor Pb, due to the inverter I4. This turns on transistor Pb and reinforces the high on the pulse circuit signal. The low on the output of inverter 210 creates a high on the output of inverter 200 which turns off the p-channel transistor Pa. By turning on transistor Pb and turning off transistor Pa, the transistors are reset to their original state.

According to an embodiment of the present invention, to adjust the pulse width (W) of the pulse generator signal, which is nominally three gate delays, a control signal is input to the inverter 200. The pull-down portion of the inverter 200 may be programmable to be faster, or slower, based on the voltage applied by the control signal. Thus, the control signal lets inverter 200 switch at a speed that is faster, or slower, than the nominal one gate delay, depending on whether the pulse width is to be increased to decreased. For example, if the inverter 200 is made slower than one gate delay, the delay caused by the reset loop path will be longer. This will cause the width (W) of each pulse to be increased by a corresponding amount.

Figure 1:
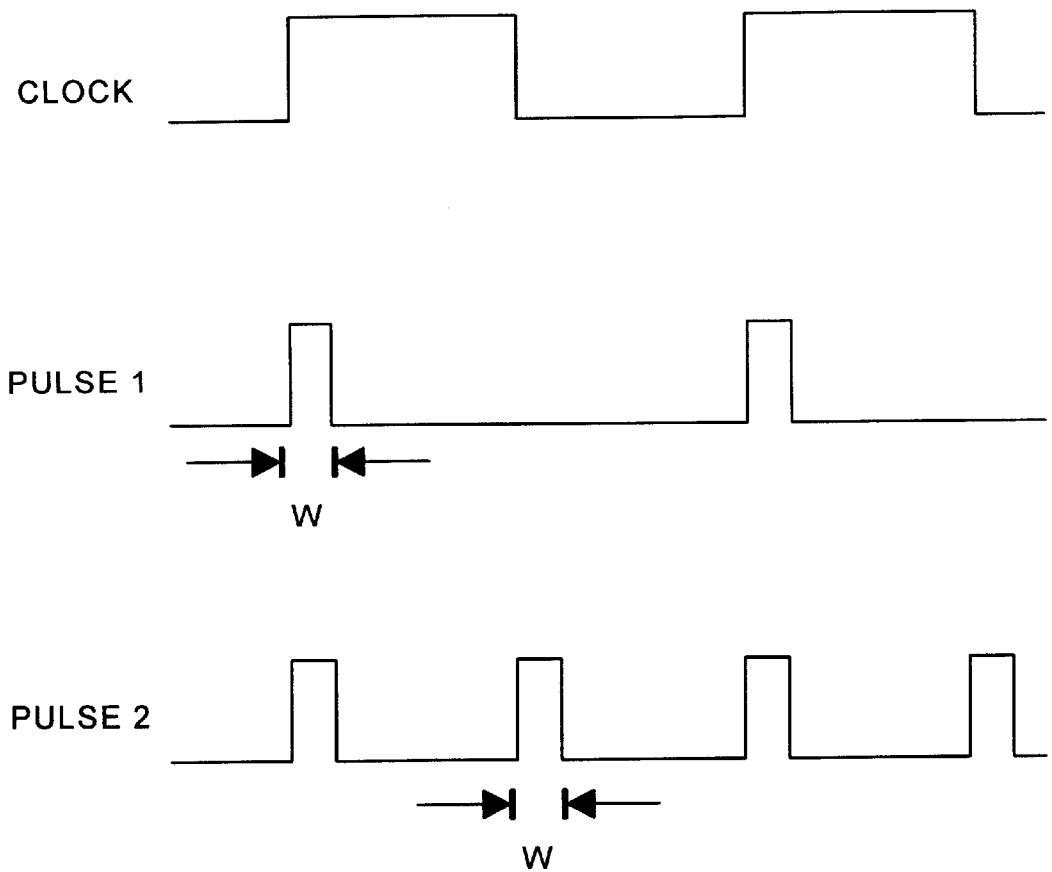
FIG. 1 illustrates a clock signal and associated pulse clock signals.

If it is desired that the pulse circuit 100 generate a variable width pulse in response to both the rising edge and a falling edge of the clock signal, such as the signal PULSE 2 shown in FIG. 1, the pulse circuit 100 may include two pulse generating circuits that generally operate independently of one another. Moreover, although a pulse circuit 100 that creates a pulse circuit signal in response to a clock signal was used to illustrate an embodiment of the present invention, another circuit that (1) generates a pulse circuit signal and (2) is reset with a reset signal may be used. Finally, instead of delaying the clock signal with the series of inverters I1, I2 and I3, combinatorial logic may be used to provide clock gating circuitry that enables or disables the circuit as desired.

Figure 3:
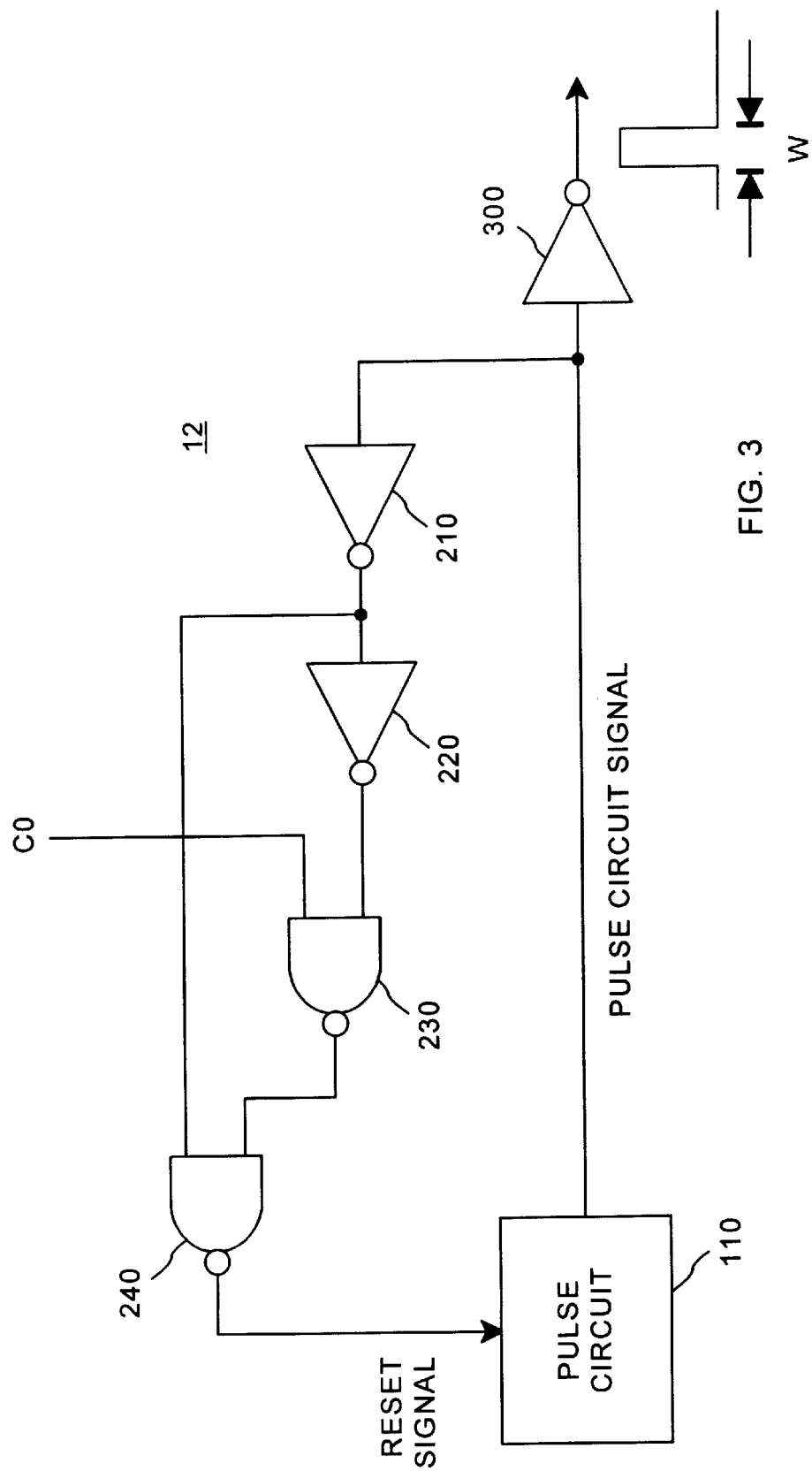
FIG. 3 is a logic-circuit diagram of a variable width pulse generator with one control signal according to an embodiment of the present invention.

FIG. 3 is a logic-circuit diagram of a variable width pulse generator 12 with one control signal C0 according to an embodiment of the present invention. In this diagram, the pulse circuit is shown as a block 110 which may be the pulse circuit 100 of FIG. 2 or another pulse circuit that (1) generates a pulse circuit signal; and (2) is reset with a reset signal fed back from the pulse circuit signal through a reset loop path. For example, the pulse circuit may generate the pulse circuit signal in response to a rising and/or a falling edge in a clock signal (not shown in FIG. 3). As before, the pulse circuit signal may pass through the output inverter 300 to provide the variable width pulse generator signal.

The reset loop shown in FIG. 3 begins with a first inverter 210 that receives the pulse circuit signal. The output of the first inverter 210 is input to a second inverter 220, which in turn is connected to a first NAND gate 230. The first NAND gate 230 also receives a control signal C0. A second NAND gate receive the output of the first NAND gate 230 along with the output of the first inverter 210. As explained below, the delay of this reset loop, or first and second inverters 210, 220 and first and second NAND gates 230, 240, is controlled by the control signal C0.

Initially, the pulse circuit signal passes through the first inverter 210 creating an inverted pulse circuit signal one gate delay later.

Consider first what happens when the control signal C0 is held high. The second inverter 220 will create a non-inverted pulse circuit signal that is delayed from the original pulse circuit signal by two gate delays, one gate delay being caused by the first inverter 210 and one gate delay being caused by the second inverter 220. Because the control signal C0 is held high, the first NAND gate 230 simply acts as an inverter for the output of the second inverter 220. Therefore, the second NAND gate 240 receives an inverted pulse circuit signal on both of its inputs, causing the second NAND gate 240 to always output a non-inverted pulse circuit signal. Thus, the output of the second NAND gate 240, or reset signal, will be a non-inverted pulse circuit signal delayed from the original pulse circuit signal by a total of four gate delays, one from each of the first and second inverters 210, 220 and first and second NAND gates 230, 240.

Consider now what happens when the control signal C0 is held low. In this case, the output of the first NAND gate 230 is always high, causing the second NAND gate 240 to simply act as an inverter for the output of the first inverter 210. Thus, the output of the second NAND gate 240, or reset signal, will be a non-inverted pulse circuit signal delayed from the original pulse circuit signal by a total of two gate delays, one from the first inverter 210 and one from the second NAND gate 240. In effect, when the control signal C0 is held low the second inverter 220 and the first NAND gate 230 are removed from the reset loop.

Recall that the pulse circuit 110 can add in another gate delay to propagate the reset signal, such as the delay caused by transistor Pa shown in FIG. 2. In this way, the time it takes for the original pulse circuit signal to reset the pulse circuit 110 will be three gate delays when the control signal C0 is held low, and five gate delays when the control signal C0 is held high. Thus, the width (W) of each pulse in the pulse generator signal will be two gate delays less when the control signal C0 is held low as compared to when the control signal C0 is held high.

Figure 4:
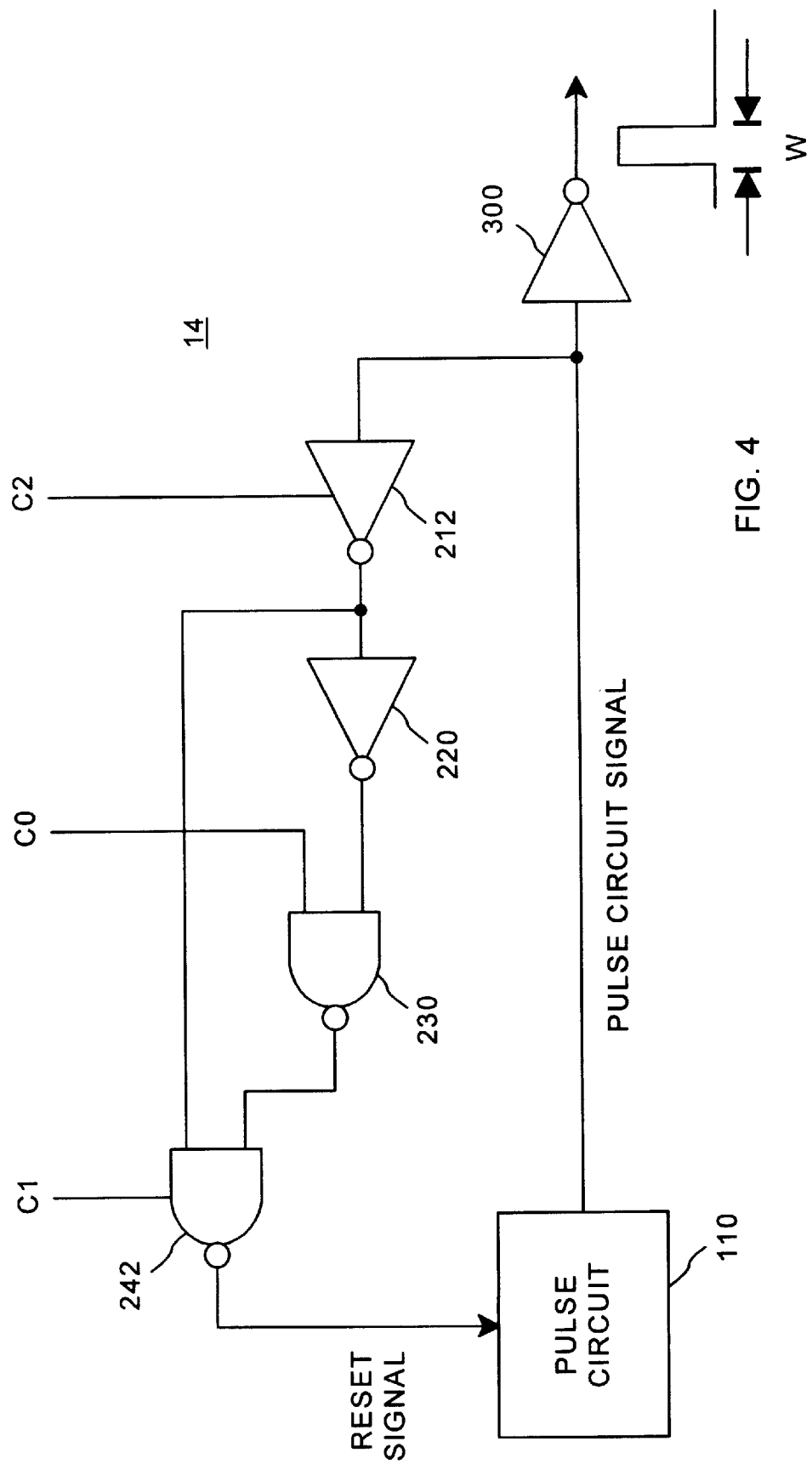
FIG. 4 is a logic-circuit diagram of a variable width pulse generator with multiple control signals according to an embodiment of the present invention.

FIG. 4 is a logic-circuit diagram of a variable width pulse generator 14 with multiple control signals C0, C1, C2 according to an embodiment of the present invention. The pulse circuit 110 and output inverter 300 work together as before to create the variable width pulse generator signal. The reset loop is also similar in operation to the one shown in FIG. 3. The difference is that the first inverter 210 is replaced with a tunable delay inverter 212, programmed with control signal C2, and the second NAND gate 240 is replaced with a tunable delay NAND gate 242, programmed with control signal C1. A "tunable delay" element is a device that does not always create a single gate delay. Instead, a control signal may determine, for example, that the delay will be slightly shorter or slightly longer than a single gate delay.

In this way, control signal C0 may provide a rough, or coarse, amount of control over the total reset loop path delay, such as, for example, between three and five gate delays. This course amount of control over the delay provides a course amount of control over the width (W) of each pulse. According to an embodiment of the present invention, the other two control signals C1 and C2 may be used to "fine tune" the total reset delay, and therefore the width of the pulse generator signal. Note that the second inverter 220 and the first NAND gate 230 are not tunable delay elements. This is because these two elements 220, 230 are not always part of the reset loop. In other words, when C0 is held low any tunable delay in the second inverter 220 or the first NAND gate will not change the pulse width (W). Between the three control signals C0, C1, C2 a total of eight different reset delays, or eight different pulse widths (W), may be provided. For example, a value of "000," representing C0, C1 and C2 respectively, may provide a short pulse width (W) while a value of "111" may provide a long pulse width.

Figure 5:
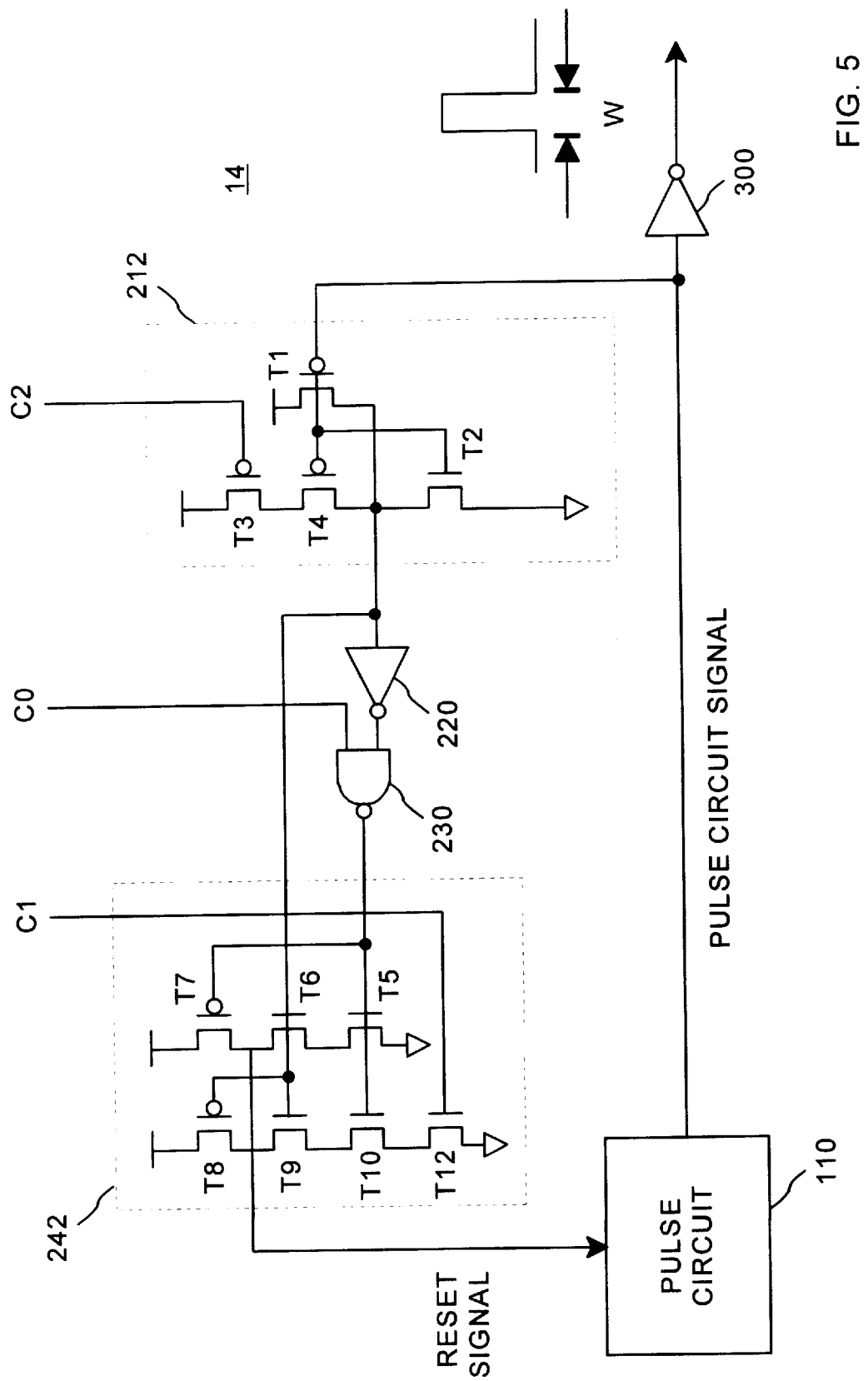
FIG. 5 is a more detailed logic-circuit diagram of the variable width pulse generator shown in FIG. 4 according to an embodiment of the present invention.

FIG. 5 is a more detailed logic-circuit diagram of the variable width pulse generator 14 shown in FIG. 4 according to an embodiment of the present invention. In particular, the tunable delay inverter 212 and tunable delay NAND gate 242 are shown in more detail.

As is known, an inverter can be formed from two transistors, such as T1 and T2 shown in FIG. 5. The tunable delay inverter 212, however, has an extra path of transistors, namely T3 and T4 connected to a pull-up voltage, that strengthens the pull-up operation of the inverter 212 by charging the node connected to transistor T4. When control signal C2 is held low, the extra path T3, T4 is activated which speeds up the inverter's pull-up operation. In contrast, when control signal C2 is held high, the extra path T3, T4 is not activated and the tunable inverter 212 acts like a normal inverter. That is, the pull-up operation is not made faster.

Likewise, it is known that a NAND gate can be formed from four transistors, such as T5, T6, T7, T8 shown in FIG. 5. The tunable delay NAND gate 242, however, has an extra transistor path, namely T9, T10 and T11 connected to a pull-down voltage, such as ground, that strengthens the pull-down path and speeds the operation of the NAND gate 242 when activated by control signal C1.

Figure 6:
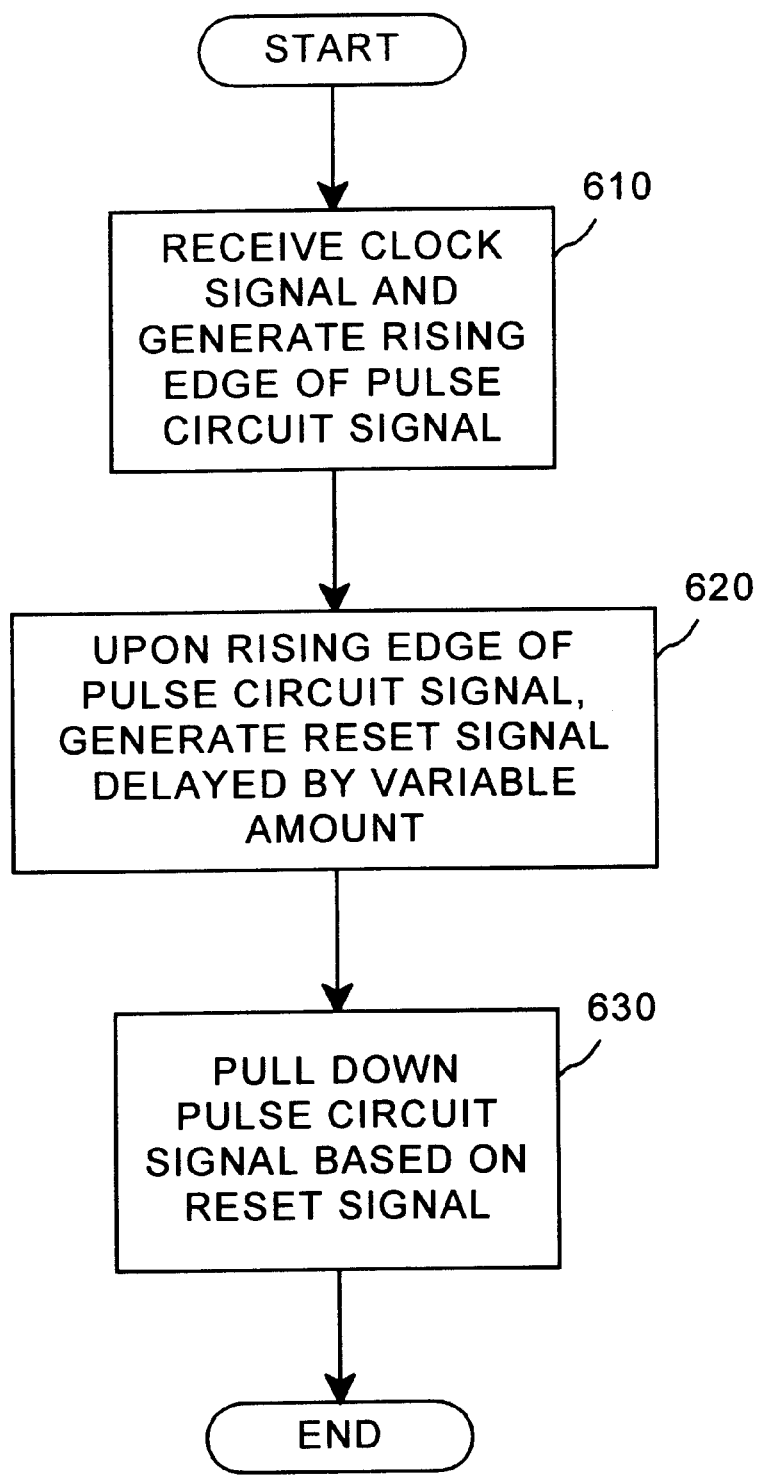
FIG. 6 is a block flow diagram of a method for generating a variable width pulse signal according to an embodiment of the present invention.

FIG. 6 is a block flow diagram of a method for generating a variable width pulse generator signal according to an embodiment of the present invention. At 610 a clock signal is received and an edge of a pulse circuit signal is generated. This edge of the pulse circuit signal generates a reset signal, delayed by a variable amount, such as a delay caused by passing through a variable delay reset loop, at 620. Finally, the pulse circuit signal is reset based on the reset signal at 630.

Although various embodiments are specifically illustrated and described herein, it will be appreciated that modifications and variations of the present invention are covered by the above teachings and within the purview of the appended claims without departing from the spirit and intended scope of the invention. For example, although reset loops containing particular elements were used to illustrate various embodiments of the present invention, it will be appreciated that other variable delay reset loops will also fall within the scope of the invention. Moreover, although software or hardware are described to control certain functions, such functions can be performed using either software, hardware or a combination of software and hardware, as is well known in the art.

What is claimed is:

1. A pulse generator, comprising:

a pulse circuit responsive to a reset signal to provide a pulse circuit signal, the pulse circuit having a group of transistors that generates a first edge of the pulse circuit signal, wherein said group of transistors comprises a stack of two N-channel transistors connected in series between the pulse circuit and ground; and a variable delay reset loop path coupled to said pulse circuit, said variable delay reset loop path directly accepts a control signal at a logic element to generate a delay in said variable delay reset loop path that varies based on the control signal, and responds to the pulse circuit signal to provide the reset signal.

2. The pulse generator of claim 1, wherein said pulse circuit is configured to produce a second edge of the pulse circuit signal in response to the reset signal.

3. The pulse generator of claim 2, wherein said pulse circuit accepts a clock signal and is configured to generate the first edge of the pulse circuit signal in response to the clock signal.

4. The pulse generator of claim 2, wherein said pulse circuit comprises:

a pre-charge transistor coupled to the reset signal, said pre-charge transistor causing said pulse circuit to generate the second edge of the pulse circuit signal.

5. The pulse generator of claim 1, wherein said variable delay reset loop path comprises:
a tunable delay element, the control signal varying the delay of said tunable delay element.

6. The pulse generator of claim 5, wherein the control signal activates a supplemental pull-up path in said tunable delay element.

7. The pulse generator of claim 1, wherein said variable delay reset loop path selectively includes said logic element, the control signal determining if said logic element is included in said variable delay reset loop path.

8. The pulse generator of claim 1, wherein said variable delay reset loop path accepts the control signal as a first control signal that determines if said logic element is included in said variable delay reset loop path and a second control signal that varies the delay of a tunable delay element in said variable delay reset loop path.

9. The pulse generator of claim 1, wherein said variable delay reset loop path accepts the control signal as a first control signal that varies the delay associated with said variable delay reset loop path a first amount, and a second control signal that varies the delay associated with said variable delay reset loop path a second amount.

10. A method of generating a variable width pulse, comprising:
generating a first edge of a pulse circuit signal using a pulse circuit having a group of transistors comprising a stack of two N-channel transistors connecting in series between the pulse circuit and ground;
generating a reset signal in response to the first edge, the reset signal directly accepting a control signal at a logic element and generating a delay from the first edge by a variable amount using a logic element according to the control signal; and
generating a second edge of the pulse circuit signal in response to the reset signal.

11. The method of claim 10, further comprising:
receiving a clock signal; and
wherein generating the first edge is performed in response to the clock signal.

12. The method of claim 10, wherein generating the reset signal is performed using a tunable delay element to delay the reset signal from the first edge, the control signal varying the delay of said tunable delay element.

13. The method of claim 12, wherein generating the reset signal is performed by activating a supplement pull-up path in the tunable delay element, based on the control signal, to delay the reset signal from the first edge.

14. The method of claim 10, further comprising:
receiving said control signal as a first control signal and a second control signal; and
wherein generating the reset signal delays the reset signal from the first edge a first amount based on the first control signal and delays the reset signal from the first edge a second amount based on the second control signal.

15. The method of claim 10, wherein generating the second edge is performed using a pre-change transistor.

16. A pulse generator, comprising:
means for generating a first edge of a pulse circuit signal using a pulse circuit having a group of transistors comprising a stack of two N-channel transistors connecting in series between the pulse circuit and ground;
means for generating a reset signal in response to the first edge, the reset signal directly accepting a control signal at a logic element and generating a delay from the first edge by a variable amount using a logic element according to the control signal; and
means for generating a second edge of the pulse circuit in response to the reset signal.

17. The pulse generator of claim 16, further comprising:
means for receiving a clock signal;
wherein said means for generating the first edge generates the first edge in response to the clock signal.

18. A pulse generator circuit, comprising:
a first pulse generator circuit receiving a reference clock as an input and outputting a first pulse in response to a rising edge of the reference clock;
a second pulse generator circuit coupled to the first pulse generator circuit and receiving as an input the reference clock, the second pulse generator circuit outputting a second pulse in response to a falling edge of the reference clock;
one of said pulse generator circuits including a variable delay circuit coupled thereto, accepting a control signal and delaying one of the output pulses by a variable amount to generate a pulse clock signal of variable width; and
a first group of transistors generating a first edge of the first output pulse in response to the rising edge of the reference clock signal, wherein said first group of transistors comprises a stack of two N-channel transistors connected in series between the output of the first pulse generator circuit and ground.

19. The pulse generator circuit of claim 18, wherein said first pulse generator circuit comprises:
a plurality of inverters in series, a first of the inverters receiving the reference clock signal as an input; and
a second group of transistors generating a second edge of the first output pulse in response to a change in the output of the first pulse generator circuit.

20. The pulse generator circuit of claim 19, wherein said first group of transistors comprises a gate of one of the N-channel transistors receiving the reference clock as an input.

21. The pulse generator circuit of claim 20, wherein said second group transistors comprise:
a keeper transistor keeping the output of the first pulse generator circuit at a predetermined voltage; and
a precharge transistor coupled in parallel with the keeper transistor.

* * * * *